(12) United States Patent
Matsumoto

(10) Patent No.: US 11,145,489 B2
(45) Date of Patent: Oct. 12, 2021

(54) MULTI-CHARGED-PARTICLE BEAM WRITING APPARATUS AND MULTI-CHARGED-PARTICLE BEAM WRITING METHOD

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/778,036

(22) Filed: Jan. 31, 2020

(65) Prior Publication Data
US 2020/0258716 A1  Aug. 13, 2020

(30) Foreign Application Priority Data
Feb. 12, 2019 (JP) .............................. JP2019-022938

(51) Int. Cl.
  *H01J 37/317* (2006.01)
  *H01J 37/04* (2006.01)
  *H01J 37/20* (2006.01)

(52) U.S. Cl.
  CPC ........ *H01J 37/3177* (2013.01); *H01J 37/045* (2013.01); *H01J 37/20* (2013.01);
  (Continued)

(58) Field of Classification Search
  CPC ...... H01J 37/3177; H01J 37/045; H01J 37/20; H01J 2237/0437; H01J 2237/0458; H01J 2237/1502
  See application file for complete search history.

(56) References Cited

U.S. PATENT DOCUMENTS

| 8,546,767 B2 | 10/2013 | Platzgummer et al. |
| 2011/0204253 A1* | 8/2011 | Platzgummer .......... H01J 37/28 250/396 R |

(Continued)

FOREIGN PATENT DOCUMENTS

| JP | 2005-302868 A | 10/2005 |
| JP | 2006140267 A * | 6/2006 |

OTHER PUBLICATIONS

Combined Taiwanese Office Action and Search Report dated Dec. 28, 2020 in Taiwanese Patent Application No. 109101635 (with unedited computer generated English translation), 13 pages.

*Primary Examiner* — David E Smith
(74) *Attorney, Agent, or Firm* — Oblon, McClelland, Maier & Neustadt, L.L.P.

(57) ABSTRACT

Provided is a multi-charged-particle beam writing apparatus including: an emitter emitting a charged particle beam; a first shaping aperture array substrate having a plurality of first apertures and forming first multiple beams by passing a part of the charged particle beam through the first apertures, respectively; a second shaping aperture array substrate having second apertures formed at positions corresponding to the respective first apertures and forming second multiple beams by passing at least a part of each of the first multiple beams through corresponding the second apertures, respectively; a blanking aperture array having third apertures formed at positions corresponding to the respective second apertures and including blankers disposed in the respective third apertures to perform blanking deflection on the respective beams of the corresponding second multiple beams; a movable mechanism moving at least one of the first shaping aperture array substrate and the second shaping aperture array substrate; and a controller controlling the movable mechanism.

12 Claims, 12 Drawing Sheets

(52) U.S. Cl.
CPC ............... *H01J 2237/0437* (2013.01); *H01J 2237/0458* (2013.01); *H01J 2237/1502* (2013.01)

(56) References Cited

U.S. PATENT DOCUMENTS

| | | | |
|---|---|---|---|
| 2012/0115306 A1 | 5/2012 | Yamazaki et al. | |
| 2015/0041672 A1* | 2/2015 | Kamikubo | H01J 37/3177 250/397 |
| 2017/0103869 A1* | 4/2017 | Matsumoto | H01J 37/3177 |
| 2017/0372869 A1* | 12/2017 | Kataoka | H01J 37/3177 |

* cited by examiner

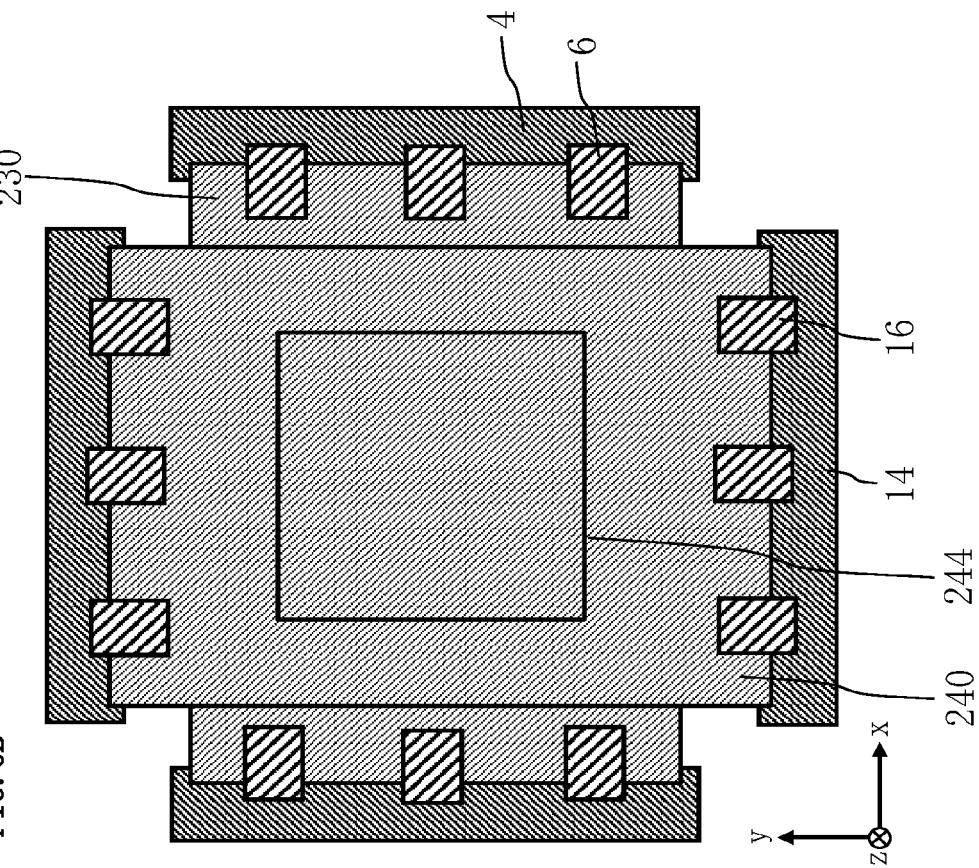
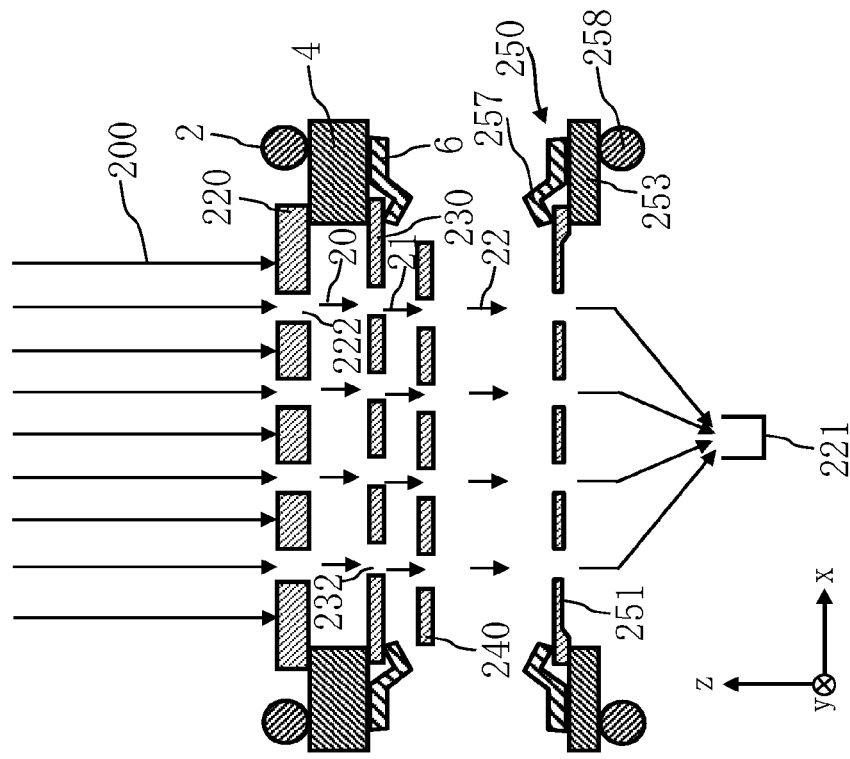

MULTI-CHARGED-PARTICLE BEAM WRITING APPARATUS AND MULTI-CHARGED-PARTICLE BEAM WRITING METHOD

CROSS-REFERENCE TO RELATED APPLICATION

This application is based upon and claims the benefit of priority from Japanese Patent Applications No. 2019-022938, filed on Feb. 12, 2019, the entire contents of which are incorporated herein by reference.

FIELD OF THE INVENTION

Embodiments relate to a multi-charged-particle beam writing apparatus and a multi-charged-particle beam writing method and relates to a method and an apparatus for adjusting sizes and current amounts of individual beams, for example, in multiple beams writing.

BACKGROUND OF THE INVENTION

A lithography technique that is responsible for progress in miniaturization of semiconductor devices is an extremely important process which uniquely generates patterns among semiconductor manufacturing processes. In recent years, with high integration of LSI, a circuit line width required for semiconductor devices has become narrow. Herein, an electron beam writing technique has an essentially excellent resolution, and thus, the writing of a mask pattern has been performed by using an electron beam to a mask blank.

For example, there is a writing apparatus using multiple beams. As compared with the case of writing with a single electron beam, irradiation with many beams can be performed at once by using the multiple beams, so that the throughput can be greatly improved. In such a multi-beam type writing apparatus, for example, multiple beams are formed from an electron beam emitted from an electron gun through a mask having a plurality of holes; each beam is blanking-controlled, so that the respective beams that have not been shielded are reduced by an optical system; and the mask image is reduced and deflected by a deflector, so that a desired position on the sample is irradiated.

An important issue in the writing with the multiple beams is to perform the writing by individually controlling characteristics such as sizes and current amounts of the respective beams while maintaining high throughput. Each beam can be adjusted by adjusting conditions of lenses of a reduced lens, an objective lens, and the like described later. However, it takes time to adjust the conditions of the lenses, and thus, there is a problem that it is difficult to improve the throughput of the writing.

If a current amount of each beam is increased, the writing time is shortened, and thus, it is possible to improve the throughput. However, charged particles contained in each beam have the same polarity charges. For example, in the case of using electron beams as charged particle beams, electrons contained in each electron beam has negative charges. For this reason, if the current amount is increased, due to the Coulomb effect originated from the Coulomb force, the repulsion of the electron beams with each other is increased. Therefore, it is difficult to write a predetermined mask pattern, and thus, there is a problem that the writing accuracy is deteriorated.

Therefore, it is considered that, in the case of writing a mask pattern not requiring a high writing accuracy, the writing is performed at a high speed by increasing the current amount; and in the case of writing a mask pattern requiring a high writing accuracy, the writing is performed at a high accuracy by decreasing the current amount. However, in this case, it is required to switch the current density for each mask pattern. Since the switching of the current density involves the adjustment of each beam by adjustment of the conditions of the lenses described above or the like, there is also a problem that it is difficult to improve the throughput of the writing.

An aspect of embodiments is to provide a multi-charged-particle beam writing apparatus and a multi-charged-particle beam writing method capable of adjusting sizes and current amounts of charged particle beams without readjustment of lens conditions.

SUMMARY OF THE INVENTION

According to an aspect of embodiments, there is provided a multi-charged-particle beam writing apparatus including: an emitter emitting a charged particle beam; a first shaping aperture array substrate having a plurality of first apertures and forming first multiple beams by passing a part of the charged particle beam through the first apertures, respectively; a second shaping aperture array substrate having second apertures formed at positions corresponding to the respective first apertures and forming second multiple beams by passing at least a part of each of the first multiple beams through corresponding the second apertures, respectively; a blanking aperture array having third apertures formed at positions corresponding to the respective second apertures and including blankers disposed in the respective third apertures to perform blanking deflection on the respective beams of the corresponding second multiple beams; a movable mechanism moving at least one of the first shaping aperture array substrate and the second shaping aperture array substrate; and a controller controlling the movable mechanism.

According to an aspect of embodiments, there is provided a multi-charged-particle beam writing method including: forming first multiple beams by allowing portions of a charged particle beam to pass through a plurality of first apertures of a first shaping aperture array substrate, respectively; forming second multiple beams by allowing at least portions of respective beams of the first multiple beams to pass through a plurality of second apertures of a second shaping aperture array substrate formed at positions corresponding to the first apertures, respectively; performing blanking deflection on the respective beams of the second multiple beams; performing measurement of transmission current of the second multiple beams on each of predetermined divided regions of the blanking aperture array; and moving at least one of the first shaping aperture array substrate and the second shaping aperture array substrate on the basis of a result of the current measurement.

BRIEF DESCRIPTION OF THE DRAWINGS

FIGS. 6A to 6B are conceptual views illustrating an example of a writing operation in the embodiment;

DETAILED DESCRIPTION OF THE EMBODIMENTS

In the following embodiment, a configuration using an electron beam as an example of a charged particle beam will be described. The charged particle beam is not limited to the electron beam, but a beam using a charged particle such as an ion beam may be used.

Embodiment

Figure 1:
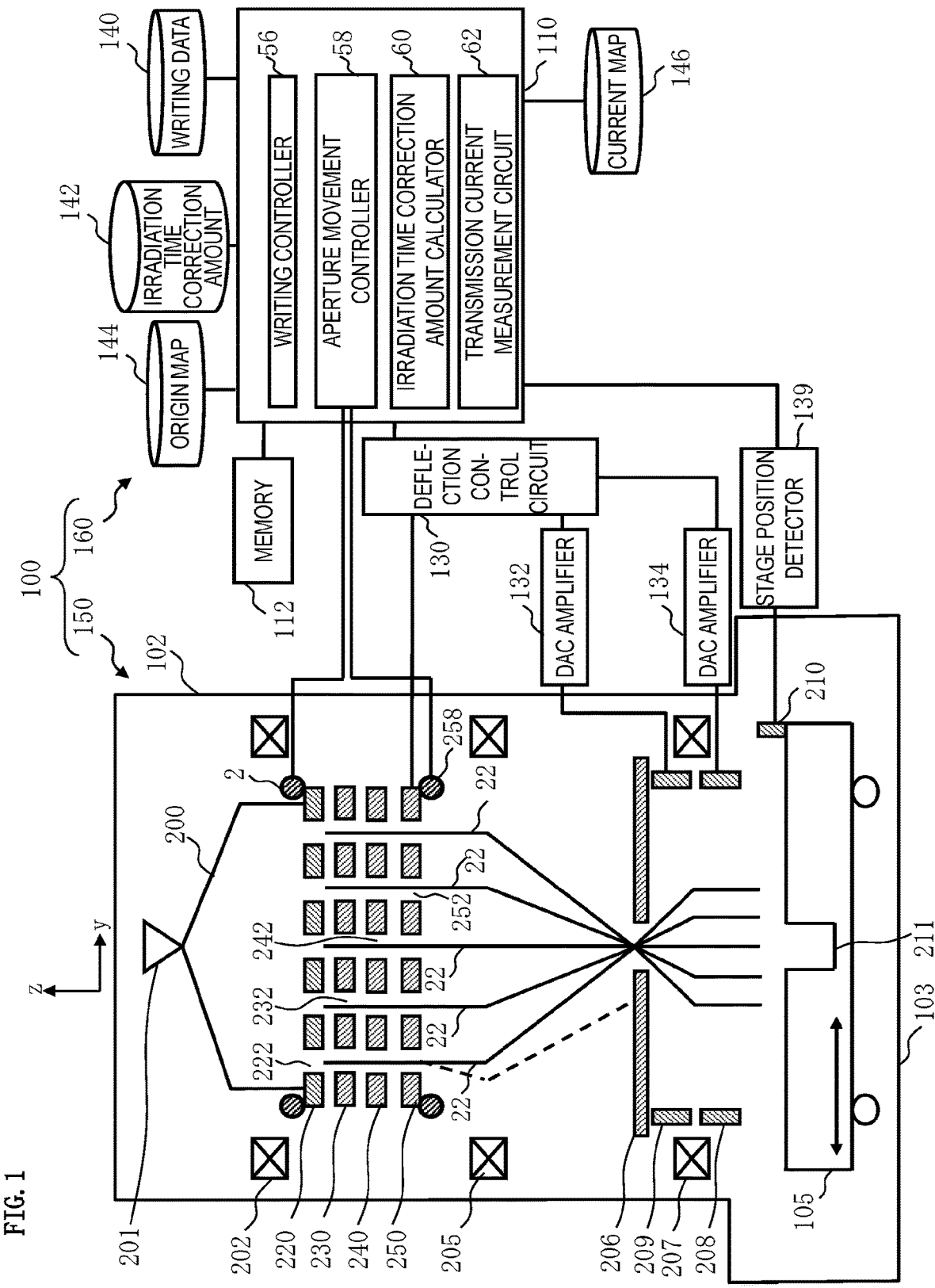
FIG. 1 is a conceptual diagram illustrating a configuration of a writing apparatus according to an embodiment.

FIG. 1 is a conceptual diagram illustrating a configuration of a writing apparatus according to an embodiment. In FIG. 1, a writing apparatus 100 includes a writing mechanism 150 and a control system circuit 160. The writing apparatus 100 is an example of a multi-charged-particle beam writing apparatus. The writing mechanism 150 includes an electron lens barrel 102 (multi-electron-beam column) and a writing chamber 103. In the electron lens barrel 102, an electron gun 201, an illumination lens 202, a limiting aperture array substrate 220, a first shaping aperture array substrate 230, a second shaping aperture array substrate 240, a blanking aperture array 250, a reduction lens 205, a limiting aperture member 206, an objective lens 207, a main deflector 208 (first deflector), and a sub-deflector 209 (second deflector) are disposed. In addition, the electron gun 201 is an example of an emitter.

The limiting aperture array substrate 220 has a plurality of fourth apertures 222. The first shaping aperture array substrate 230 has a plurality of first apertures 232. The second shaping aperture array substrate 240 has a plurality of second apertures 242. The blanking aperture array 250 has a plurality of third apertures 252. The first shaping aperture array substrate 230 and the second shaping aperture array substrate 240 are connected to the ground potential by wires (not illustrated).

The first shaping aperture array substrate 230 and the second shaping aperture array substrate 240 are used for shaping the multiple beams. The blanking aperture array 250 is used for deflecting a portion or all of the multiple beams. The limiting aperture array substrate 220 suppresses electron beams 200 that are not used in writing from striking the first shaping aperture array substrate 230. When the electron beams strike the first shaping aperture array substrate 230, the first shaping aperture array substrate 230 generates heat. Since the first shaping aperture array substrate 230 is thermally expanded by the heat generation, the shapes and disposition of the first apertures 232 are shifted, and thus, there occur shifts in current amounts, shapes, writing positions, and the like of the respective beams of the multiple beams to be formed. Therefore, the limiting aperture array substrate 220 is provided so as to suppress the heat generation of the first shaping aperture array substrate 230.

The limiting aperture array substrate 220 is, for example, a silicon substrate. In this case, it is preferable to suppress excessive heat generation and localized heat generation of the limiting aperture array substrate 220 by using, for example, a silicon substrate doped with impurities having a large film thickness.

The first shaping aperture array substrate 230 and the second shaping aperture array substrate 240 are, for example, semiconductor substrates doped with impurities. In order to accurately form the first apertures 232 and the second apertures 242, it is preferable to use a silicon (Si) substrate.

Herein, for the convenience of description, the vertical direction is defined as a Z direction, one direction of the horizontal directions perpendicular to the vertical direction is defined as an X direction, and the horizontal direction perpendicular to the Z and X directions is defined as a Y direction. A first movable mechanism (movable mechanism) 2 for moving the limiting aperture array substrate 220 and the first shaping aperture array substrate 230 in a plane parallel to an XY plane and a second movable mechanism 258 for moving the blanking aperture array 250 in a plane parallel to the XY plane are provided in the electron lens barrel 102. In addition, the first movable mechanism 2 may be a movable mechanism for moving only the first shaping aperture array substrate 230.

In the multi-charged-particle beam writing apparatus and the multi-charged-particle beam writing method according to an aspect of embodiments, by relatively moving the first shaping aperture array substrate 230 in parallel to the second shaping aperture array substrate 240 in the XY plane, the overlapping manner of the first apertures 232 and the second apertures 242 in the vertical direction is changed, so that the size and current amount of the charged particle beam can be adjusted.

An XY stage 105 is disposed in the writing chamber 103. A beam absorption electrode (Faraday cup 211) for measuring the current of the electron beam is disposed on the XY stage 105. In addition, at the time of writing, a sample (not illustrated) such as a mask blank coated with resist which is to be a writing target substrate is disposed on the XY stage 105. Herein, the sample includes an exposure mask at the time of manufacturing a semiconductor device, a semiconductor substrate (silicon wafer) in which a semiconductor device is to be manufactured, or the like. Furthermore, a mirror 210 for position measurement of the XY stage 105 is disposed on the XY stage 105. The XY stage 105 is movable in the XY plane.

The control system circuit 160 includes a control computer 110, a memory 112, a deflection control circuit 130, digital-to-analog converter (DAC) amplifier 132 and 134, a stage position detector 139, a writing data storage memory 140, an irradiation time correction amount storage memory 142, an origin map storage memory 144, and a current map storage memory 146. The control computer 110, the memory 112, the deflection control circuit 130, the DAC amplifier 132 and 134, the stage position detector 139, the writing data storage memory 140, the irradiation time correction amount storage memory 142, the origin map storage memory 144, and the current map storage memory 146 are connected to each other via a bus (not illustrated).

The writing data storage memory 140, the irradiation time correction amount storage memory 142, the origin map storage memory 144, and the current map storage memory 146 include, for example, a recording medium such as a magnetic disk device, a magnetic tape device, an FD, a read only memories (ROM), or a solid state drive (SSD).

The DAC amplifier 132 and 134 and the blanking aperture array 250 are connected to the deflection control circuit 130. The output of the DAC amplifier 132 is connected to the sub-deflector 209. The output of the DAC amplifier 134 is connected to the main deflector 208. The stage position detector 139 irradiates the mirror 210 on the XY stage 105 with laser light and receives the reflected light from the mirror 210. Then, the position of the XY stage 105 is measured by utilizing the principle of laser interference using information of such reflected light.

A writing controller 56, an aperture movement controller (controller) 58, an irradiation time correction amount calculator 60, and a transmission current measurement circuit 62 are provided in the control computer 110. The writing controller 56, the aperture movement controller (controller) 58, the irradiation time correction amount calculator 60, and the transmission current measurement circuit 62 includes a processing circuit. Such processing circuit includes, for example, an electric circuit, a computer, a processor, a circuit board, a quantum circuit, or a semiconductor device. In addition, a common processing circuit (same processing circuit) may be used, or different processing circuits (separate processing circuits) may be used for the writing controller 56, the aperture movement controller (controller) 58, the irradiation time correction amount calculator 60, and the transmission current measurement circuit 62. Information input to or output from information in operation in the writing controller 56, the aperture movement controller (controller) 58, the irradiation time correction amount calculator 60, and the transmission current measurement circuit 62 can be stored in the memory 112 in each case.

The aperture movement controller 58 is connected to the first movable mechanism 2 and the second movable mechanism 258. The aperture movement controller 58 can move the limiting aperture array substrate 220, the first shaping aperture array substrate 230, and the blanking aperture array 250 by using the first movable mechanism 2 and the second movable mechanism 258.

In addition, the writing data is input from the outside of the writing apparatus 100 and is stored in the writing data storage memory 140. In the writing data, typically information of a plurality of figure patterns for writing is defined. Specifically, figure code, coordinates, size, and the like are defined for each figure pattern. Alternatively, figure code, coordinates of each vertex, and the like are defined for each figure pattern.

Herein, FIG. 1 illustrates a configuration required for describing the embodiments. The writing apparatus 100 may be provided with any configuration other than the required configuration typically.

Figure 2:
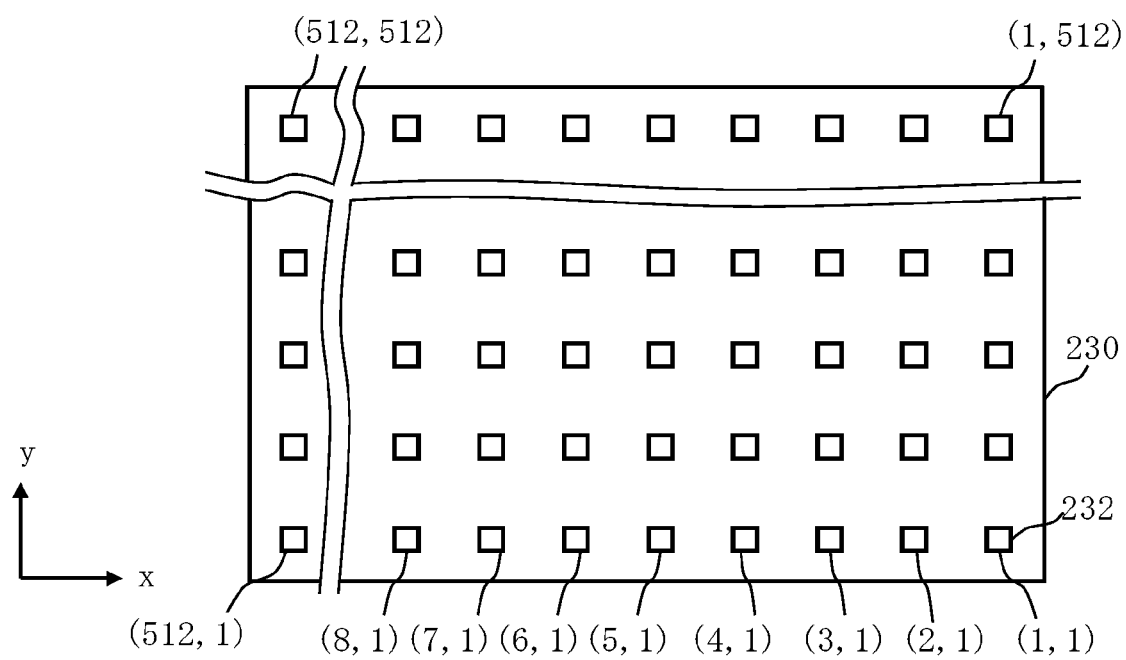
FIG. 2 is a conceptual diagram illustrating a configuration of a limiting aperture array substrate, a first shaping aperture array substrate, and a second shaping aperture array substrate in the embodiment.

FIG. 2 is a conceptual diagram illustrating a configuration of the first shaping aperture array substrate 230 in the embodiment. Longitudinal (y direction) p columns x transverse (x direction) q columns (p, q≥2) holes (first apertures 232) are formed in a matrix shape at a predetermined disposition pitch. In FIG. 2, for example, the first apertures 232 of the 512×512 columns in the longitudinal and transverse directions (in the x and y directions) are formed. The first apertures 232 are formed together in a rectangular shape with the same dimensions. Alternatively, the first apertures 232 may be circular with the same diameter. By allowing portions of the electron beam 200 to pass through the first apertures 232, respectively, the multiple beams 20 are formed. In addition, a method of disposing the first apertures 232 is not limited to a case where the longitudinal and transverse apertures are disposed in a grid as illustrated in FIG. 2. For example, the holes of the k-th stage column and the (k+1)-th stage column in the longitudinal direction (y direction) may be disposed to be shifted by a distance "a" in the transverse direction (x direction). Similarly, the holes of the (k+1)-th stage column and the (k+2)-th stage column in the longitudinal direction (y direction) may be disposed to be shifted by a distance "b" in the transverse direction (x direction).

In addition, although FIG. 2 illustrates the configuration of the first shaping aperture array substrate 230 and the first apertures 232, the configuration of the second shaping aperture array substrate 240 and the second apertures 242 and the configuration of the limiting aperture array substrate 220 and the fourth apertures 222 are also similar. For example, the number of first apertures 232, the number of second apertures 242, the number of third apertures 252, and the number of fourth apertures 222 are equal. On the other hand, the shapes of the first apertures 232 and the shapes of second apertures 242 may be the same or may be different. By allowing the shapes of the first apertures 232 and the shapes of the second apertures 242 to be different, it is possible to form multiple beams having various shapes.

Herein, it is preferable that the sizes of the fourth apertures 222 are larger than the sizes of the first apertures 232 corresponding to the respective beams of the multiple beams formed by the fourth apertures 222. If the sizes of the fourth apertures 222 are equal to or smaller than the sizes of the first apertures 232 corresponding to the respective beams of the multiple beams formed by the fourth apertures 222, the multiple beams smaller than the sizes of the fourth apertures 222 cannot be formed, so that the degree of freedom of the formation of the multiple beams by the first shaping aperture array substrate 230 and the second shaping aperture array substrate 240 is decreased. As described above, the limiting aperture array substrate 220 in which fourth apertures 222 are provided is intended to suppress the surplus electron beams that are not used for writing from striking the first shaping aperture array substrate 230. Therefore, it is preferable that the fourth apertures 222 are larger than the first apertures 232 so as to suppress surplus electron beams from striking the first shaping aperture array substrate 230 and not to impair a degree of freedom of the electron beam shaping by the first shaping aperture array substrate 230 and the second shaping aperture array substrate 240.

Figure 3:
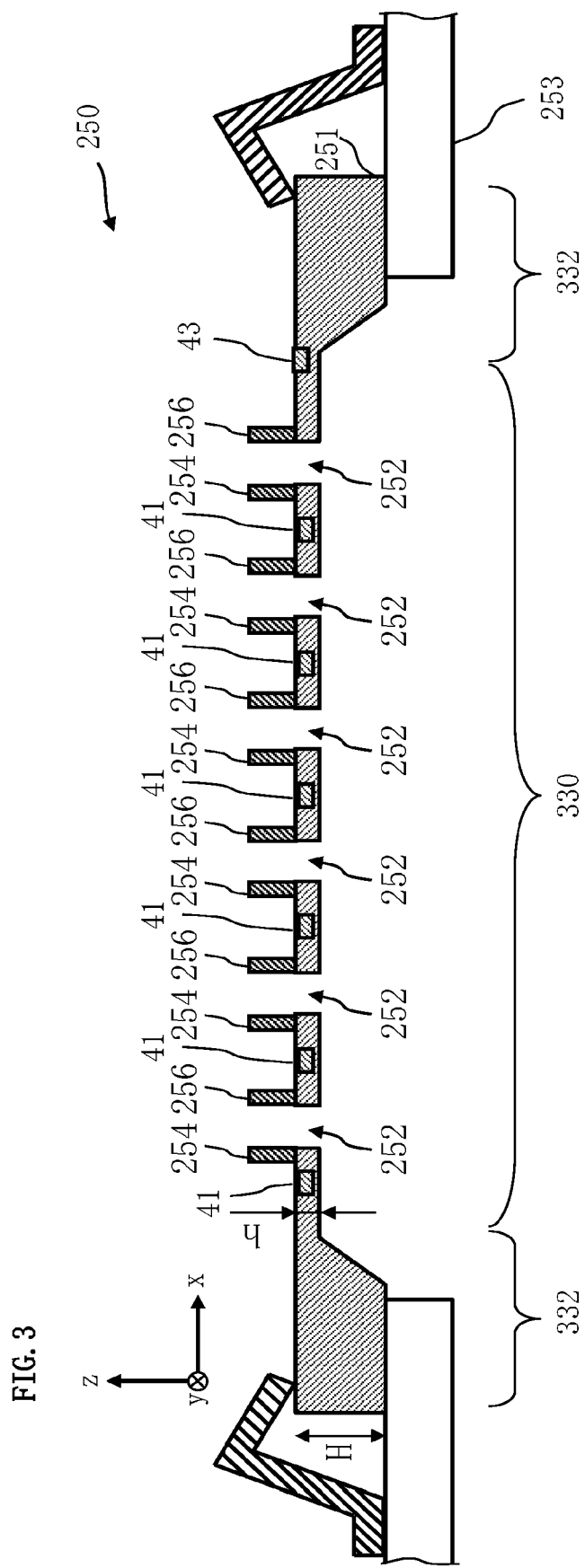
FIG. 3 is a cross-sectional view illustrating a configuration of a blanking aperture array mechanism in the embodiment.
Figure 4:
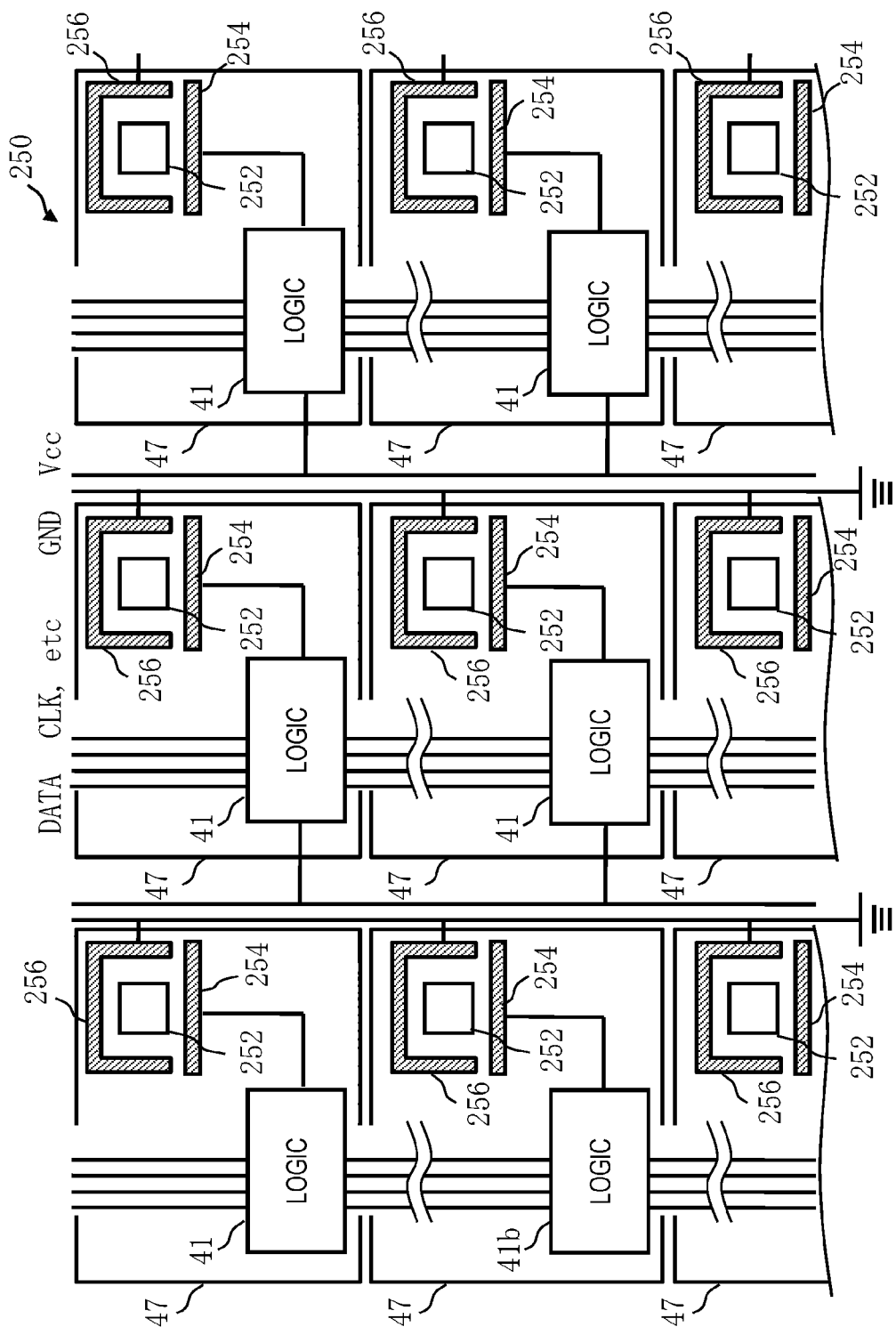
FIG. 4 is a conceptual top view illustrating a portion of the configuration of the blanking aperture array mechanism in a membrane region in the embodiment.

FIG. 3 is a cross-sectional view illustrating a configuration of the blanking aperture array 250 in the embodiment. FIG. 4 is a conceptual top view illustrating a portion of the configuration of the blanking aperture array 250 in the membrane region in the embodiment. In addition, in FIGS. 3 and 4, the positional relationships among the control electrode 254, the counter electrode 256, the control circuit 41, and the pad 43 are not described to match with each other. In addition, the numbers of the third apertures 252, the control electrodes 254, the counter electrodes 256, and the control circuits (logic circuits) 41 may be different from those illustrated in FIGS. 3 and 4. In addition, the number of the first apertures 232 illustrated in FIG. 2 and the number of the third apertures 252 illustrated in FIGS. 3 and 4 are not matched.

In the blanking aperture array 250, as illustrated in FIG. 3, the blanking aperture array substrate 251 made of Si (silicon) or the like is disposed on the blanking aperture array support base 253. The blanking aperture array substrate 251 is, for example, a semiconductor substrate. The central portion of the blanking aperture array substrate 251 is, for example, scraped thinly from the back surface side to be processed into a membrane region 330 (first region) having a thin film thickness h. The periphery surrounding the membrane region 330 is an outer peripheral region 332 (second region) having a large thickness H. The upper surface of the membrane region 330 and the upper surface of the outer peripheral region 332 are formed so as to be at the same height position or at substantial height positions. The blanking aperture array substrate 251 is held on the blanking aperture array support base 253 at the back surface of the outer peripheral region 332. The central portion of the blanking aperture array support base 253 is opened, and the position of the membrane region 330 is positioned in the opened region of the blanking aperture array support base 253.

The third apertures 252 for passage of the respective beams of the multiple beams are disposed at the positions corresponding to the fourth apertures 222 of the limiting aperture array substrate 220, the first apertures 232 of the first shaping aperture array substrate 230, and the second apertures 242 of the second shaping aperture array substrate 240 in the membrane region 330. In addition, in other words, the third apertures 252 through which the respectively corresponding beams of the multiple beams using the electron beam pass are formed in an array in the membrane region 330 of the blanking aperture array substrate 251.

Then, a plurality of electrode pairs having two electrodes at positions facing each other and interposing the corresponding third apertures 252 of the third apertures 252 are disposed on the membrane region 330 of the blanking aperture array substrate 251, respectively. Specifically, as illustrated in FIGS. 3 and 4, sets (blankers: blanking deflectors) of the control electrode 254 and the counter electrode 256 for blanking deflection and interposing the corresponding third apertures 252 are disposed at positions in the vicinity of each of the third apertures 252 on the membrane region 330, respectively. In addition, the control circuit 41 (logic circuit) for applying a deflection voltage to the control electrode 254 for each of the third apertures 252 is disposed in the vicinity of each of the third apertures 252 on the membrane region 330 in the blanking aperture array substrate 251. The counter electrode 256 is connected to the ground potential.

In addition, as illustrated in FIG. 4, each control circuit 41 is connected to parallel wiring of n bits (for example, 10 bits) for the control signal. Besides other n-bit parallel wires for the control signal, clock signal lines and wires for the read signal, the shot signal, and the power supply are connected to each control circuit 41. The clock signal lines and wires for the read signal, the shot signal, and the power supply may be configured by using a portion of the parallel wires. For each beam constituting the multiple beams, an individual blanking mechanism 47 is configured with the control electrode 254, the counter electrode 256, and the control circuit 41. In addition, in the example of FIG. 3, the control electrode 254, the counter electrode 256, and the control circuit 41 are disposed in the membrane region 330 having a small film thickness of the blanking aperture array substrate 251. In addition, the disposition of the control electrode 254, the counter electrode 256, and the control circuit 41 is not limited to that illustrated in FIGS. 3 and 4.

In addition, the control circuits 41 formed in an array shape on the membrane region 330 are grouped, for example, by the same row or the same column, the control circuits 41 in the group are connected in series as illustrated in FIG. 4. Then, a signal from the pad 43 disposed for each group is transmitted to the control circuits 41 in the group. Specifically, a shift register (not illustrated) is disposed in each of the control circuits 41, and for example, shift registers in the control circuits 41 for the beams, for example, in the same row among the p×q multiple beams are connected in series. Then, for example, the control signal of the beam in the same row of the p×q multiple beams is transmitted in series, and, for example, the control signal for each beam is stored in the corresponding control circuit 41 with p times of the clock signal.

Figure 5:
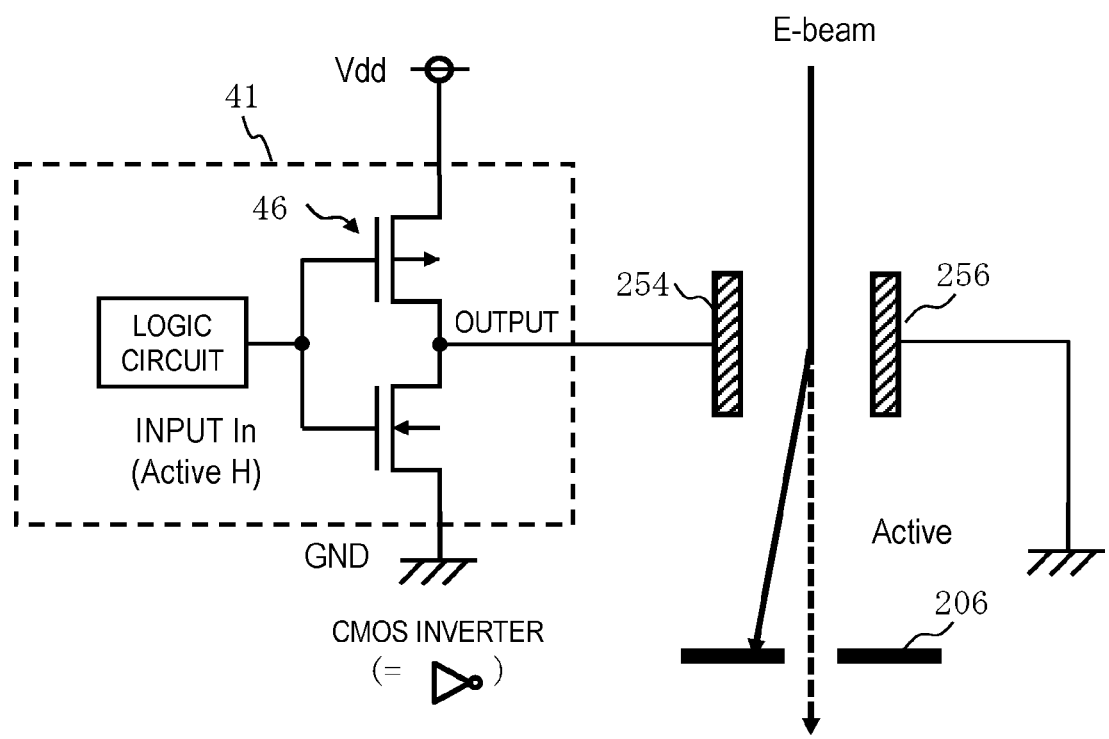
FIG. 5 is a diagram illustrating an example of an individual blanking mechanism according to the embodiment.

FIG. 5 is a diagram illustrating an example of the individual blanking mechanism 47 according to the embodiment. In FIG. 5, the amplifier 46 (an example of a switching circuit) is disposed in the control circuit 41. In the example of FIG. 5, a complementary MOS (CMOS) inverter circuit is disposed as an example of the amplifier 46. Then, the CMOS inverter circuit is connected to a positive potential (Vdd: blanking potential: first potential) (for example, 5 V) and a ground potential (GND: second potential). The output line (OUT) of the CMOS inverter circuit is connected to the control electrode 254. On the other hand, the counter electrode 256 is applied with the ground potential. Then, a plurality of control electrodes 254 to which the blanking potential and the ground potential are switchably applied are disposed at the positions facing the counter electrodes 256 corresponding to each of the plurality of counter electrodes 256 with the third apertures 252 corresponding to each of the plurality of third apertures 252 interposed on the substrate 31.

As a control signal, one of an L (low) potential (for example, ground potential) lower than a threshold voltage and a H (high) potential (for example, 1.5 V) higher than a threshold voltage is applied to the input (IN) of the CMOS inverter circuit. In the embodiment, in the state where the L potential is applied to the input (IN) of the CMOS inverter circuit, the output (OUT) of the CMOS inverter circuit becomes the positive potential (Vdd), and thus, the corresponding electron beam (E-beam) is deflected by the electric field due to the potential difference from the ground potential of the counter electrode 256, so that the beam is controlled to be in the beam OFF by being shielded by the limiting aperture member 206. On the other hand, in the state (active state) where the H potential is applied to the input (IN) of the CMOS inverter circuit, the output (OUT) of the CMOS inverter circuit becomes the ground potential, and thus, the corresponding the electron beam (E-beam) is not deflected due to the elimination of the potential difference from the ground potential of the counter electrode 256, so that the beam is controlled to be in the beam ON by passing through the limiting aperture member 206.

The electron beam (E-beam) passing through each passage hole is deflected by a voltage applied to two electrodes of the control electrodes 254 and the counter electrode 256 to be independently in pairs. The blanking control is performed by the deflection. Specifically, the set of the control electrode 254 and the counter electrode 256 respectively individually performs blanking deflection on the corresponding electron beams of the multiple beams by the potentials to be switched by the CMOS inverter circuits which become the corresponding switching circuits. In this manner, a plurality of blankers perform the blanking deflection on the corresponding beams among the multiple beams passing through the second apertures 242 of the second shaping aperture array substrate 240.

FIGS. 6A to 6B are conceptual views illustrating disposition of the limiting aperture array substrate 220, the first shaping aperture array substrate 230, the second shaping aperture array substrate 240, and the blanking aperture array 250 and a supporting method in the embodiment. FIG. 6A is a schematic cross-sectional view of the limiting aperture array substrate 220, the first shaping aperture array substrate 230, the second shaping aperture array substrate 240, and the blanking aperture array 250 in a plane parallel to the YZ plane. FIG. 6B is a schematic view illustrating disposition of the first shaping aperture array substrate 230, first support bases 4, first support fittings 6, the second shaping aperture array substrate 240, second support bases 14, and second support fittings 16 when viewed upwardly from the lower side in the vertical direction.

In addition, in FIGS. 6A to 6B, the shapes, disposition, and numbers of the fourth apertures 222, the first apertures 232, the second apertures 242, and third apertures 252 do not match with the illustration of FIGS. 1, 2, 3, and 4. In addition, the control circuit 41, the control electrode 254, and the counter electrode 256 illustrated in FIGS. 3 and 4 are omitted in illustration.

The centers of the first support bases 4 are opened. Then, the limiting aperture array substrate 220 is disposed on the first support base 4 so that the fourth apertures 222 are disposed on the opened portions of the first support bases 4. The electron beam 200 emitted from the electron gun 201 illuminates the entire fourth apertures 222 of the limiting aperture array substrate 220 substantially vertically by the illumination lens 202. Then, the electron beam 200 passes through each of the fourth apertures 222, so that the multiple beams 20 (third multiple beams) are formed. The shape of the multiple beams 20 is obtained by reflecting the shape of the plurality of fourth apertures 222 and is, for example, a rectangular shape.

As illustrated in FIG. 6A, the first shaping aperture array substrate 230 is fixed below the first support base 4 by using, for example, the first support fitting 6. In this case, the first apertures 232 are disposed below the portion of the first support base 4 which is opened. Furthermore, the first apertures 232 are disposed to be aligned with the trajectories of the respective beams of the multiple beams 20. A part of the respective beams of the multiple beams 20 pass through the first apertures 232, respectively, so that the multiple beams (first multiple beams) are formed.

By allowing the first movable mechanism 2 to move the first support base 4, the limiting aperture array substrate 220 and the first shaping aperture array substrate 230 can be moved in the XY plane. The first movable mechanism 2 may be a "roller" having a cylindrical cross section as illustrated in FIG. 6A. However, it is preferable to use an actuator such as a piezoelectric element, by which it is possible to move with a high accuracy. In addition, the limiting aperture array substrate 220 may not move in the XY plane by the first movable mechanism 2. Since the limiting aperture array substrate 220 is directly irradiated with the electron beam as described above, the heat generation amount is large. This is because, if the limiting aperture array substrate 220 is not assumed to be moved by a movable mechanism, the cooling is facilitated.

As illustrated in FIG. 6A, the second shaping aperture array substrate 240 is disposed below the first shaping aperture array substrate 230. The second apertures 242 are disposed to be aligned with the trajectories of the respective beams of the multiple beams 21 (first multiple beams). Then, at least part of each of the multiple beams 21 pass through the corresponding the second apertures, respectively, so that the multiple beams (second multiple beams) are formed.

As illustrated in FIG. 6B, in a case where the first shaping aperture array substrate 230 and the second shaping aperture array substrate 240 has, for example, a rectangular shape, it is preferable that the longitudinal direction of the first shaping aperture array substrate 230 is disposed parallel to the X direction, and the longitudinal direction of the second shaping aperture array substrate 240 is disposed parallel to the Y direction. Accordingly, it is preferable that the first shaping aperture array substrate 230 is supported at the end in the longitudinal direction of the first shaping aperture array substrate 230 by using the first support base 4 and the first support fitting 6, and the second shaping aperture array substrate 240 is supported at the end in the longitudinal direction of the second shaping aperture array substrate 240 by using the second support base 14 and the second support fitting 16. The gap in the Z direction between the first shaping aperture array substrate 230 and the second shaping aperture array substrate 240 is preferably narrow for example, about 1 mm in order to increase the accuracy at the end of the multiple beams 22 (second multiple beams) to be described later, but this is too narrow for a human to put a hand in. For this reason, it is very difficult to access the gap between the first shaping aperture array substrate 230 and the second shaping aperture array substrate 240. Therefore, the longitudinal direction of the first shaping aperture array substrate 230 and the longitudinal direction of the second shaping aperture array substrate 240 are disposed so as to be perpendicular to each other as in FIG. 6B. In this manner, it is possible to access the gap between the first shaping aperture array substrate 230 and the second shaping aperture array substrate 240 to some extent from the X direction as well as from the Y direction. In addition, the region 244 of the second shaping aperture array substrate 240 is a region in which the second apertures 242 are disposed.

In addition, the second shaping aperture array substrate 240 may be moved in the XY plane by the movable mechanism or the like.

The blanking aperture array 250 is disposed below the second shaping aperture array substrate 240. The third apertures 252 are disposed to be aligned with the trajectories of the respective beams of the multiple beams 22. The blankers deflect the respective beams of the multiple beams 22 individually passing (performs blanking deflection).

The multiple beams 22 passing through the blanking aperture array 250 is reduced by the reduction lens 205 and travel toward the hole at the center formed on the limiting aperture member 206. Herein, the electron beam deflected by the blanker is shifted in position from the hole at the center of the limiting aperture member 206, so that the electron beam is shielded by the limiting aperture member 206. On the other hand, the electron beam that is not deflected by the blanker passes through the hole at the center of the limiting aperture member 206. By ON/OFF of the individual blanking mechanism, blanking control is performed, so that ON/OFF of the beam is controlled. Thus, the limiting aperture member 206 shields the respective beams deflected so as to be in the state of the beam OFF by the individual blanking mechanism 47. Then, for each beam, the beam corresponding to one shot is formed by the beam being formed from the time of becoming the beam ON to the time of being the beam OFF and passing through the limiting aperture member 206.

The multiple beams 22 passing through the limiting aperture member 206 are focused by the objective lens 207 to become a pattern image with a desired reduction ratio, and the respective beams (entire multiple beams 22) passing through the limiting aperture member 206 are deflected collectively in the same direction by the main deflector 208 and the sub-deflector 209. Then, the interior of the Faraday cup 211 is irradiated. In a case where the sample is disposed on the XY stage 105, the respective irradiation positions of the sample are irradiated.

Figure 7:
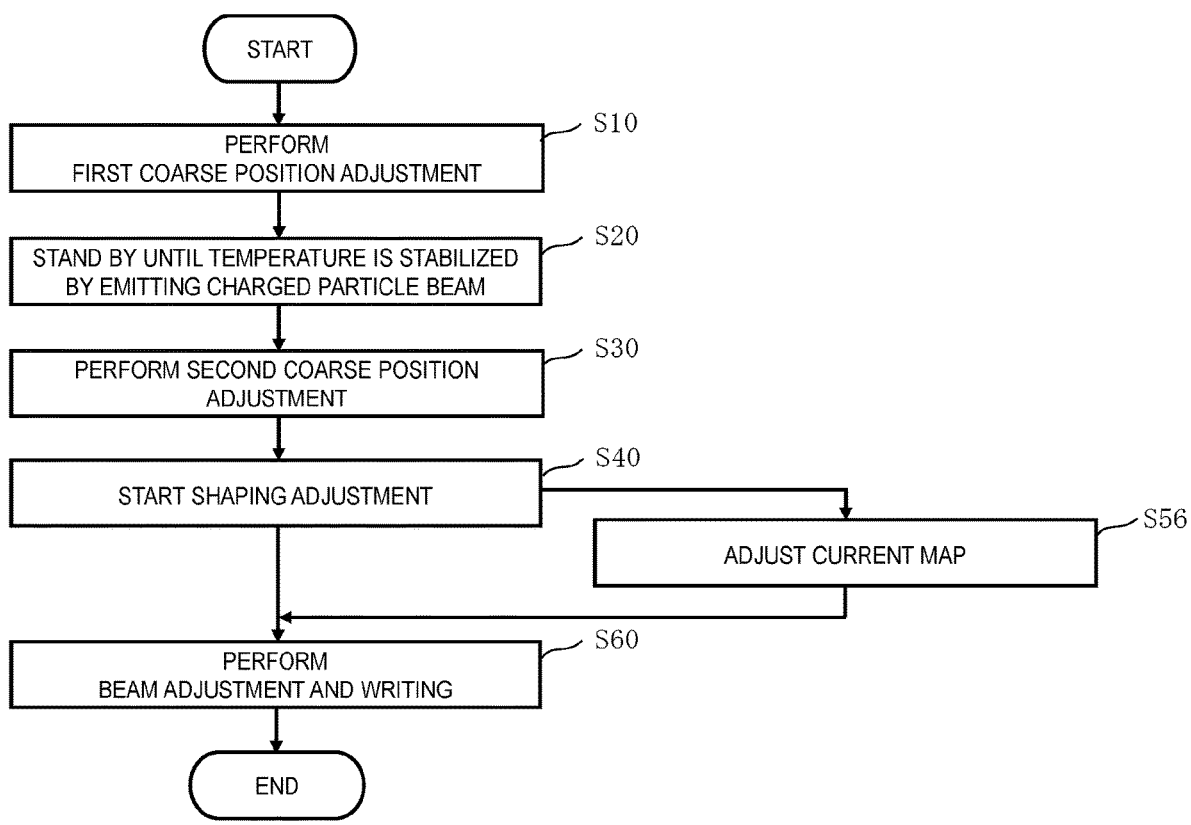
FIG. 7 is a flowchart of a multi-charged-particle beam writing method according to the embodiment.
Figure 8:
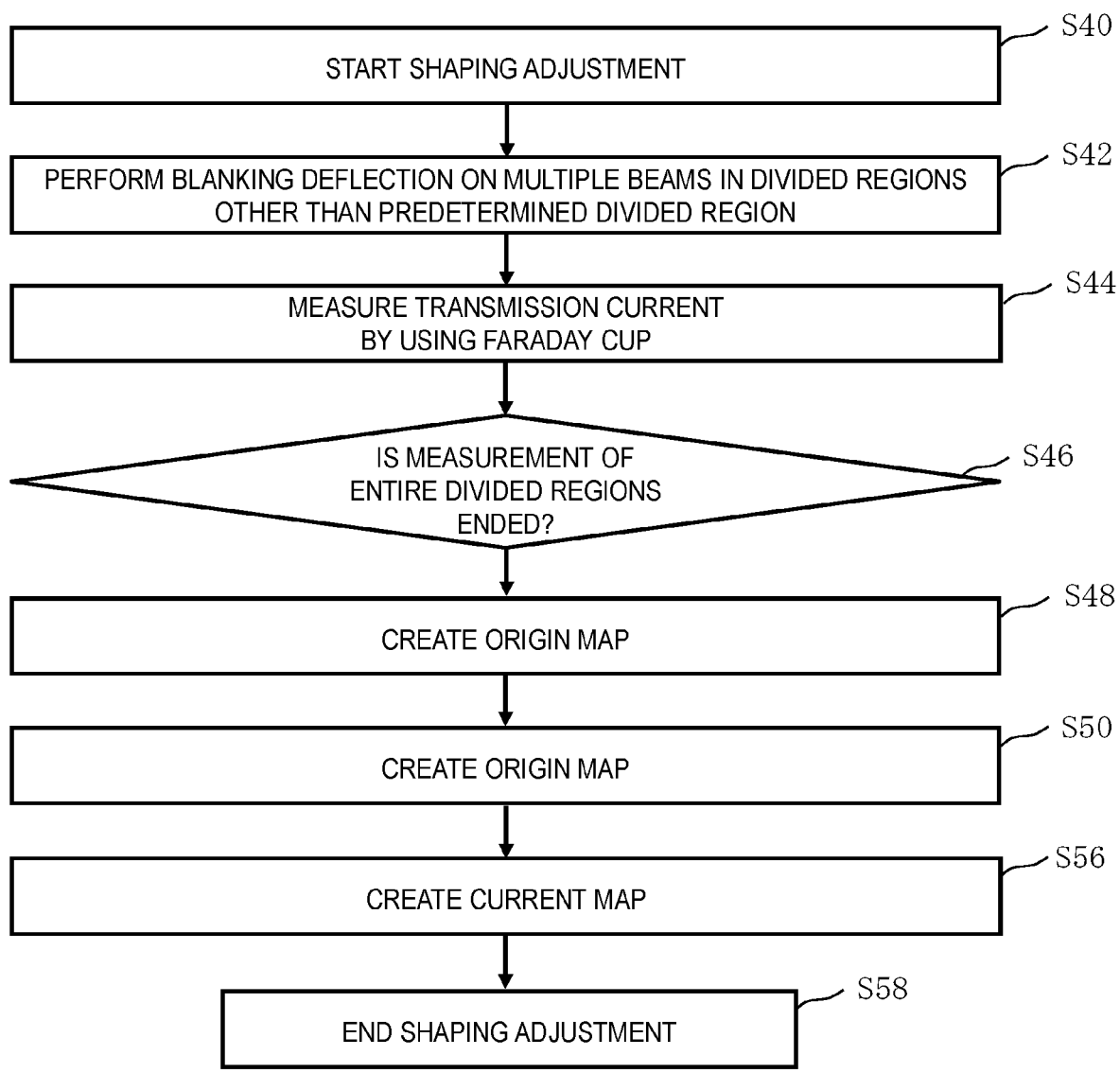
FIG. 8 is a flowchart of a multi-charged-particle beam writing method related to adjustment of multiple charged particle beams in the embodiment.

FIG. 7 is a flowchart of a multi-charged-particle beam writing method according to the embodiment. FIG. 8 is a flowchart of a multi-charged-particle beam writing method related to adjustment of multiple charged particle beams in the embodiment. Hereinafter, the description will be made with reference to both FIGS. 7 and 8.

First, first coarse position adjustment is performed (S10). This is performed because, in the initial setting of the limiting aperture array substrate 220, the first shaping aperture array substrate 230, the second shaping aperture array substrate 240, and the blanking aperture array 250, it is unknown whether or not the fourth apertures 222, the first apertures 232, the second apertures 242, and the third apertures 252 are aligned in the vertical direction to allow the multiple beams to be capable of passing through. For this reason, without emitting the electron beams 200 from the electron gun 201, the coarse position adjustment is performed. For example, it is checked by using an optical microscope or the like whether or not there is a portion through which the fourth apertures 222, the first apertures 232, the second apertures 242, and third apertures 252 pass in the vertical direction. In addition, the position alignment of the limiting aperture array substrate 220, the first shaping aperture array substrate 230, the second shaping aperture array substrate 240, and the blanking aperture array 250 may be performed at a degree of visual alignment.

Then, the electron beam 200 (an example of a charged particle beam) is emitted from the electron gun 201. Thus, in particular, the limiting aperture array substrate 220 is heated. In addition, the first shaping aperture array substrate 230, the second shaping aperture array substrate 240, and the blanking aperture array 250 are also heated. Since a change in shapes and dimensions of the apertures due to thermal expansion of the aperture involved with the heating occurs, a change in shapes, sizes, and current amounts of the multiple beams occurs. Therefore, the first shaping aperture array substrate 230, the second shaping aperture array substrate 240, and the blanking aperture array 250 are in a stand-by state until the temperature is stable by the heating (S20).

Next, second coarse position adjustment is performed (S30). This adjustment is intended to adjust the multiple beams formed by the limiting aperture array substrate 220, the first shaping aperture array substrate 230, and the second shaping aperture array substrate 240 to pass through the blanking aperture array 250.

Then, shaping adjustment is started (S40). First, the blanking deflection using the blankers is performed so that the multiple beams 22 passing through the blanking aperture array 250 reach the Faraday cup 211 with respect to a predetermined region (predetermined divided region) of, for example, about 16×16 columns or about 32×32 columns among the 512×512 columns in the longitudinal and transverse directions (the x and y directions) illustrated in FIG. 2 and the multiple beams 22 do not reach the Faraday cup 211 with respect to the other regions (S42).

Figure 9A:
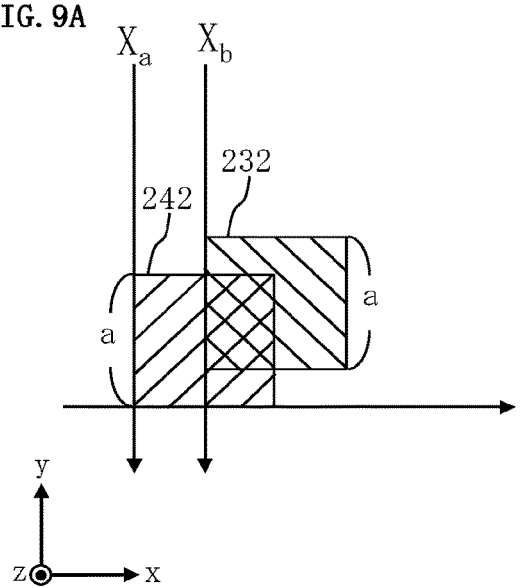
FIGS. 9A to 9C are conceptual diagrams illustrating an example of a method of adjusting multiple charged particle beams in the embodiment.
Figure 9B:
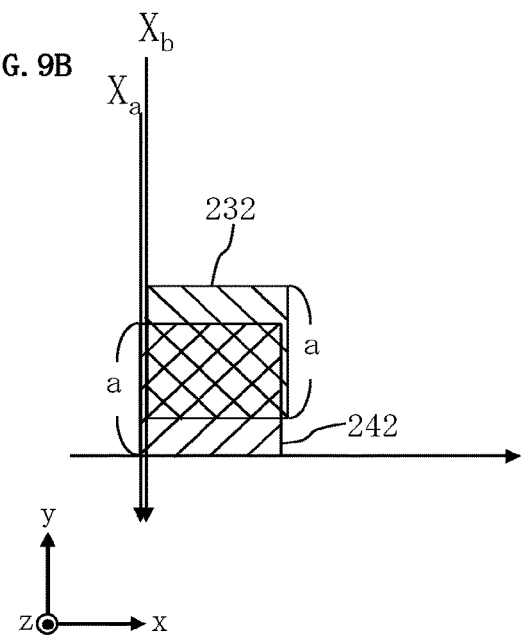
Figure 9C:
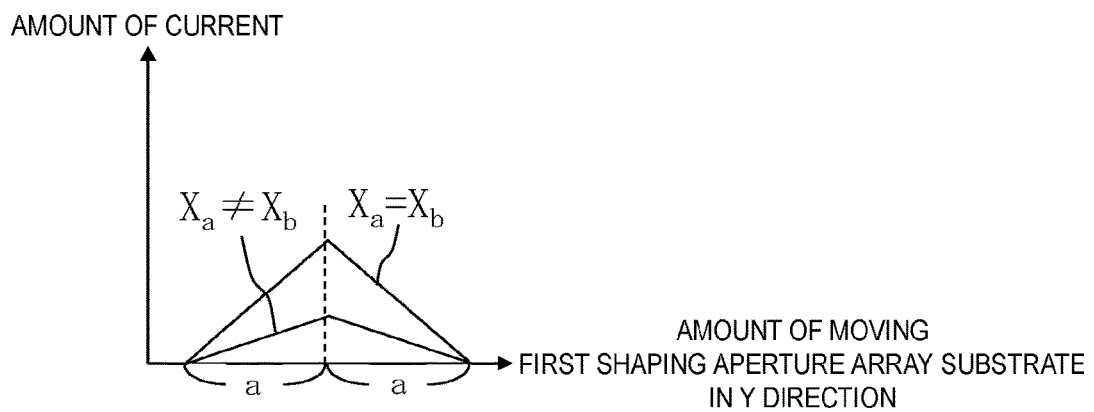

Next, for alignment origin measurement, the transmission current measurement circuit 62 performs measurement of the transmission current of the multiple beams passing through the predetermined divided region described above without being subjected to the blanking deflection (S44) by using the Faraday cup 211. The measurement of the transmission current is performed, while moving, for example, the first shaping aperture array substrate 230 or the second shaping aperture array substrate 240. FIGS. 9A to 9C illustrate conceptual views of an example of a method of adjusting the multiple charged particle beams in the embodiment. One of the first apertures 232 and one of the second apertures 242 are illustrated in FIGS. 9A and 9B. Herein, both the first apertures 232 and the second apertures 242 are assumed to have a square shape having the same size. When the first shaping aperture array substrate 230 is moved in the Y direction by using the first movable mechanism 2, the overlapped portion between one of the first apertures 232 and one of the second apertures 242 is changed as viewed in the Z direction. Thus, accordingly, the current amounts of the respective beams of the multiple beams passing through both one of the first apertures 232 and one of the second apertures 242 are changed.

Further, in FIG. 9A, one side of the square of one of the first apertures 232 in the left side of the paper surface and one side of the square of one of the second apertures 242 in the left side of the paper surface are shifted from each other. On the other hand, in FIG. 9B, one side of the square of one of the first apertures 232 in the left side of the paper surface and one side of the square of one of the second apertures 242 in the left side of the paper surface are substantially overlapped with each other. Furthermore, one side of the square of one of the first apertures 232 in the right side of the paper surface and one side of the square of one of the second apertures 242 in the right side of the paper surface are substantially overlapped with each other. For this reason, a larger current amount of the multiple beams is obtained from the case of disposition illustrated in FIG. 9B.

FIG. 9C illustrates the changes in the current amounts the respective beams of the multiple beams passing through both one of the first apertures 232 and one of the second apertures 242 when the first shaping aperture array substrate 230 moved in the Y direction. For the case of FIG. 9C, a larger amount of current can be obtained. If similar operations are also performed in the X direction, it is possible to obtain the relative position (alignment position) of the first shaping aperture array substrate 230 and the second shaping aperture array substrate 240 at which the largest current amount in a predetermined divided region can be obtained. In the above, although a series of operations are performed with respect to one of the first apertures 232 and one of the second apertures 242, it is preferable to determine the alignment position while measuring the current amounts of the multiple beams by the Faraday cup 211 all at once with respect to a predetermined region of for example, about 16×16 columns or about 32×32 columns. This work is carried out for all the divided regions (S46).

Figure 10:
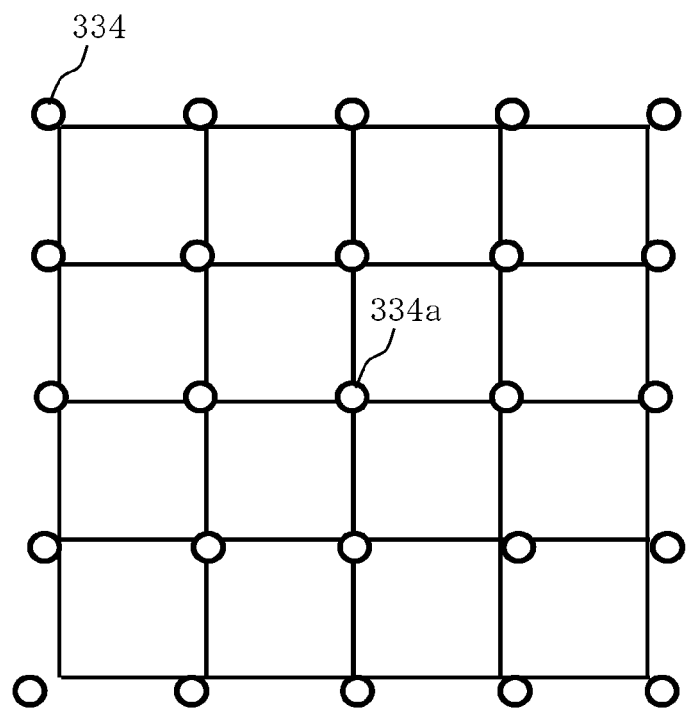
FIG. 10 is an example of an origin map win the embodiment.

Next, the origin map is created on the basis of the measurement result obtained in (S44) (S48), and a relative positional relationship between the first shaping aperture array substrate 230 and the second shaping aperture array substrate 240 is determined (S50). The origin map created is stored, for example, in the origin map storage memory 144. FIG. 10 is an example of the origin map in the embodiment. Although a total of 25 circles 334 are illustrated in FIG. 10, each one of the circles 334 indicates the position which is irradiated with the respective one of the multiple beams through the circle. In addition, the grid of a total of 16 squares illustrates approximate positions. Among the total of 25 circles, the center of a circle 334a illustrated in the central portion is substantially coincident with the point at which the square grid is formed. On the other hand, as the centers of the other circles 334 are farther from the central circle 334a, the shift from the point where the square grid is formed becomes large. This shift is due to the difference between the thermal expansion of the first shaping aperture array substrate 230 and the thermal expansion of the second shaping aperture array substrate 240. Even though the limiting aperture array substrate 220 is provided, since the first shaping aperture array substrate 230 disposed at a position closer to the electron gun 201 is further heated than the second shaping aperture array substrate 240, the degree of thermal expansion becomes large. For this reason, there occur shifts of the positions of the other 24 circles 334 from the position of the central circle 334a among the 25 circles 334. The shift in the position is related to the shift in the current amount of each beam (variation). That is, the current amount of the beam associated with the central circle 334a is relatively large. On the other hand, with respect to the other beams, since a relative shift occurs in the positional relationship between one of the first apertures 232 and one of the second apertures 242, the current amount becomes relatively small.

Therefore, the irradiation time correction amount calculator 60 calculates the irradiation time correction amount in the predetermined divided region of the electron beam on the basis of the current amount of the measured electron beam. The calculated irradiation time correction amount is stored in the irradiation time correction amount storage memory 142. For example, in a case where the current amount of the electron beam is small, the irradiation time correction amount is calculated so that the irradiation time becomes long. In addition, in a case where the electron amount of the electron beam is large, the irradiation time correction amount is calculated so that the irradiation time becomes short. Accordingly, it is possible to adjust the variation in current amount of the multiple beams. The above results are stored, for example, as a current map in the current map storage memory 146 (S56). Thus, the adjustment of shaping is ended (S58), and writing is performed (S60).

Figure 11:
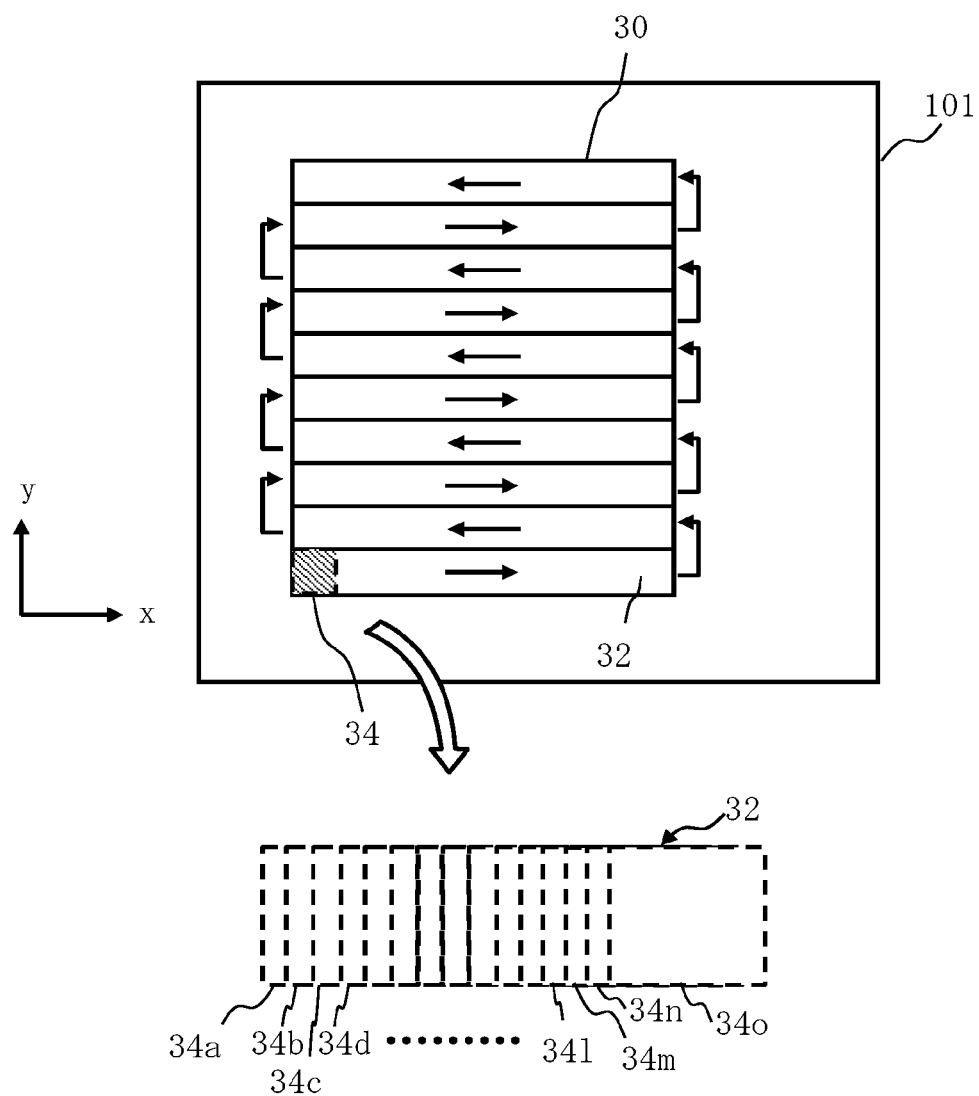
FIG. 11 is a conceptual diagram illustrating an example of a writing operation on a sample in the embodiment.

FIG. 11 is a conceptual diagram illustrating an example of a writing operation on a sample in the embodiment. As illustrated in FIG. 11, the writing region 30 of the sample is virtually divided, for example, into a plurality of strip-shaped stripe regions 32 having a stripe shape with a predetermined width in the y direction. First, by moving the XY stage 105, the irradiation region 34 capable of being irradiated with one-time shot of the multiple beams is adjusted so as to be positioned at the left end of the first stripe region 32 or a position of further left side, and the writing is started. When the first stripe region 32 is to be written, by moving the XY stage 105, for example, in the −x direction, the writing is performed relatively in the x direction. The XY stage 105 is, for example, continuously moved at a constant speed. After the writing of the first stripe region 32 is ended, by moving the position of the stage in the −y direction, the irradiation region 34 is adjusted so as to be positioned at the right end of the second stripe region 32 or a position of further right side relatively in the y direction, and in turn, by moving the XY stage 105, for example, in the x direction, the writing is performed toward the −x direction in the same manner. As the writing is performed toward the x direction in the third stripe region 32 and the writing is performed toward the −x direction in the fourth stripe region 32, the writing time can be shortened by performing the writing while alternately changing the direction. However, the writing is not limited to the case of performing the writing while alternately changing the direction, but the writing may be performed in the same direction when writing each stripe region 32.

Figure 12:
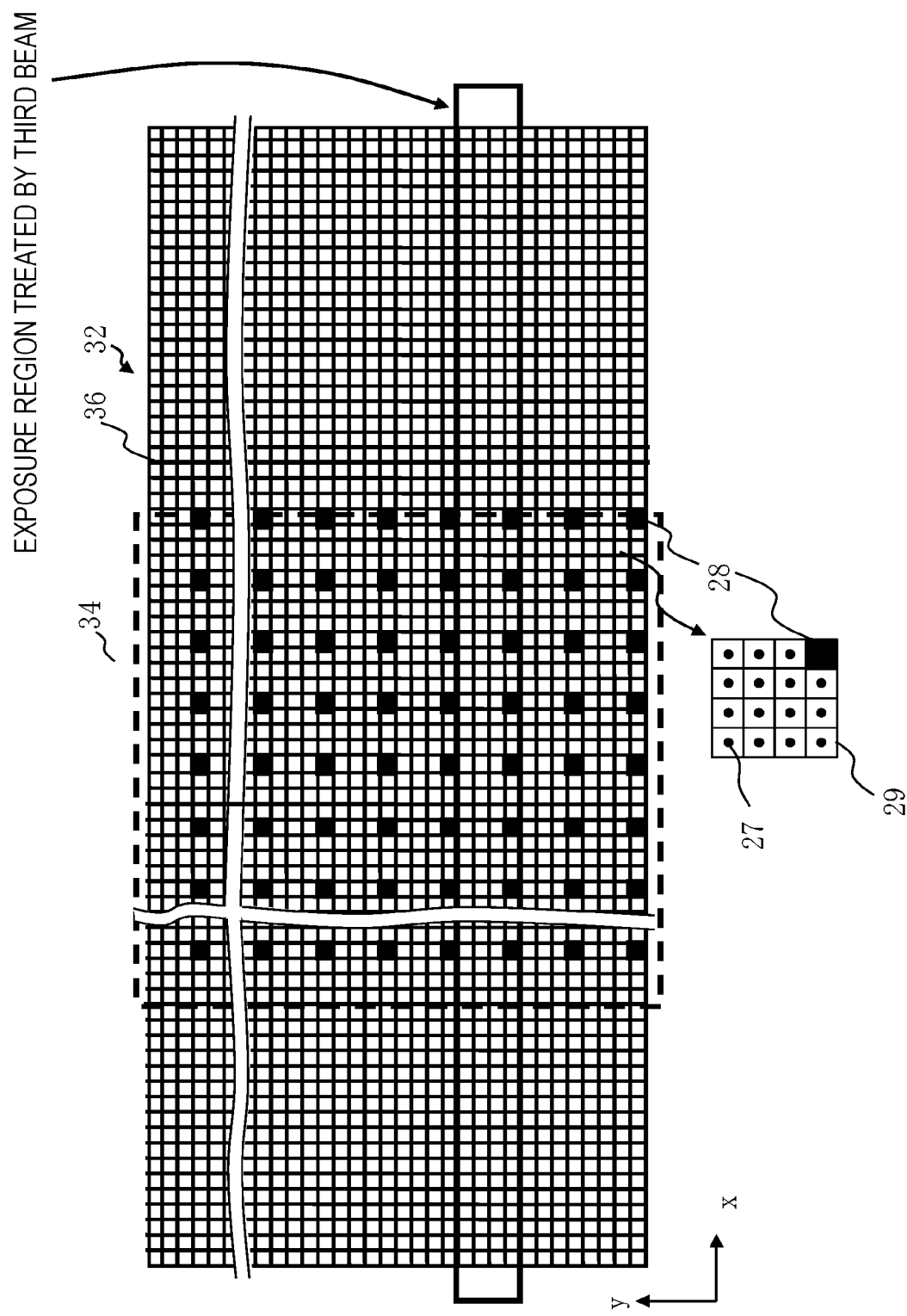
FIG. 12 is a view illustrating an example of an irradiation region of multiple beams and writing target pixels in the embodiment.

FIG. 12 is a view illustrating an example of an irradiation region of the multiple beams and writing target pixels in the embodiment. In FIG. 12, a plurality of control grids 27 (design grids) which are disposed in a grid shape, for example, with a beam size pitch of the multiple beams on the sample surface are set in the stripe region 32. For example, the disposition pitch of about 10 nm is preferred. The control grids 27 become the irradiation positions of the multiple beams 20 of the design. The disposition pitch of the control grids 27 is not limited to the beam size, but the disposition pitch may be configured with a size that can be controlled as a deflection position of the sub-deflector 209 regardless of the beam size. Then, a plurality of pixels 36 which are virtually divided in a mesh shape with the same size as disposition pitch of the control grids 27 are set by using each control grid 27 as a center. Each pixel 36 becomes an irradiation unit region per beam of the multiple beams. The example of FIG. 12 illustrates a case where the writing region of the sample is divided into a plurality of stripe regions 32, for example, with a size and substantially the same width size capable of irradiating the irradiation region 34 (writing field) by one-time irradiation of the multiple beams in the y direction. The x direction size of the irradiation region 34 may be defined by a value obtained by multiplying the number of beams in the x direction to the beam pitch in the x direction of the multiple beams 20. The y direction size of the irradiation region 34 may be defined by a value obtained by multiplying the number of beams in the y direction to the beam pitch in the y direction of the multiple beams 20. In addition, the width of the stripe region 32 is not limited thereto. The size that is n times of the irradiation region 34 (n is an integer of 1 or more) is preferred. In the example of FIG. 12, the multiple beams of, for example, 512×512 columns are illustrated as the multiple beams of 8×8 columns by omission in illustration. Then, a plurality of pixels 28 (writing positions of beams) that can be irradiated with one shot of the multiple beams 20 are illustrated in the irradiation region 34. In other words, the pitch between adjacent pixels 28 becomes the pitch between the beams of the multiple beams on design. In the example of FIG. 12, one sub-irradiation region 29 (beam pitch region) is configured in a square region being surrounded by four adjacent pixels 28 and including one pixel 28 among the four pixels 28. In the example of FIG. 12, illustrated is a case where each sub-irradiation region 29 is configured with 4×4 (=16) pixels.

Heretofore, the embodiments have been described with reference to specific examples. However, embodiments are not limited to these specific examples. In addition, the portions not directly required for the description of embodiments, such as the configuration of the apparatus and the control method, and the like have been omitted in description. However, the configuration of the apparatus and the control method to be required may be selectively used as appropriate. For example, although the configuration of the controller for controlling the writing apparatus 100 is omitted in description, it is needless to say that the required configuration of the controller may be selectively used as appropriate.

Besides, all the multi-charged-particle beam writing apparatuses and the multi-charged-particle beam writing methods that include the elements of embodiments and can be appropriately modified by those skilled in the art are included within the scope of embodiments.

What is claimed is:

1. A multi-charged-particle beam writing apparatus, comprising:
an emitter emitting a charged particle beam;
a first shaping aperture array substrate having a plurality of first apertures and forming first multiple beams by passing a part of the charged particle beam through the first apertures, respectively, each of the first apertures having a first edge;
a second shaping aperture array substrate having second apertures formed at positions corresponding to the respective first apertures and forming second multiple beams by passing at least a part of each of the first multiple beams through the corresponding second apertures, respectively, each of the second apertures having a second edge;
a blanking aperture array having third apertures formed at positions corresponding to the respective second apertures and including blankers disposed in the respective third apertures to perform blanking deflection on the respective beams of the corresponding second multiple beams;
a movable mechanism moving at least one of the first shaping aperture array substrate and the second shaping aperture array substrate;
a controller controlling the movable mechanism;
a transmission current measurement circuit measuring a current of the second multiple beams transmitting respectively through the blanking aperture array; and
an origin map storage memory storing an origin map indicating a relative positional relationship between the first shaping aperture array substrate and the second shaping aperture array substrate, the origin map being created on the basis of a result of the measurement,
wherein each of the second multiple beams is shaped by both of the first edge and the second edge.

2. The multi-charged-particle beam writing apparatus according to claim 1, further comprising a limiting aperture array substrate having a plurality of fourth apertures, each of the fourth apertures having a size larger than a size of each of the first apertures and forming third multiple beams by passing a part of the charged particle beam through the fourth apertures, respectively,
wherein a part of each of the third multiple beams passes through the respective first apertures, respectively.

3. The multi-charged-particle beam writing apparatus according to claim 1, wherein shapes of the first apertures and shapes of the second apertures are different from each other.

4. The multi-charged-particle beam writing apparatus according to claim 1, wherein the transmission current measurement circuit measures the current of the second multiple beams transmitting respectively through a plurality of divided regions of the blanking aperture array.

5. The multi-charged-particle beam writing apparatus according to claim 1, further comprising an irradiation time correction amount calculator calculating an irradiation time correction amount for adjusting a variation in current amount of the second multiple beams on the basis of a result of the measurement.

6. The multi-charged-particle beam writing apparatus according to claim 5, further comprising an irradiation time correction amount storage memory storing the irradiation time correction amount.

7. The multi-charged-particle beam writing apparatus according to claim 6, further comprising a current map storage memory storing a current map with the variation in current amount of the second multiple beams being adjusted, by using the irradiation time correction amount.

8. A multi-charged-particle beam writing method, comprising:
forming first multiple beams by allowing portions of a charged particle beam to pass through a plurality of first apertures of a first shaping aperture array substrate, respectively;
forming second multiple beams by allowing at least portions of respective beams of the first multiple beams to pass through a plurality of second apertures of a second shaping aperture array substrate formed at positions corresponding to the first apertures, respectively;
performing blanking deflection on the respective beams of the second multiple beams;
performing measurement of transmission current of the second multiple beams on each of predetermined divided regions of a blanking aperture array; and
moving at least one of the first shaping aperture array substrate and the second shaping aperture array substrate on the basis of a result of the current measurement.

9. The multi-charged-particle beam writing method according to claim 8,
wherein a correction amount of irradiation time in the predetermined divided region is calculated on the basis of a result of the current measurement, and
wherein the irradiation time of the respective beams of the second multiple beams is corrected by using the correction amount.

10. The multi-charged-particle beam writing method according to claim 8, further comprising forming third multiple beams by allowing portions of the charged particle beam to pass through a plurality of fourth apertures provided in a limiting aperture array, respectively,
wherein at least portions of the respective beams of the third multiple beams corresponding to the first apertures pass through the first apertures.

11. The multi-charged-particle beam writing method according to claim 8, wherein shapes of the first apertures and shapes of the second apertures are different from each other.

12. The multi-charged-particle beam writing method according to claim 8, comprising storing an origin map indicating a relative positional relationship between the first shaping aperture array substrate and the second shaping aperture array substrate, the origin map being created by the current measurement.

* * * * *